(12) United States Patent
Kwon et al.

(10) Patent No.: US 11,700,749 B2
(45) Date of Patent: Jul. 11, 2023

(54) TRANSPARENT DISPLAY DEVICE

(71) Applicant: LG Display Co., Ltd., Seoul (KR)

(72) Inventors: Hyeokjun Kwon, Paju-si (KR); Jonghwan Ock, Paju-si (KR); ChangSoo Kim, Paju-si (KR); Soonhwan Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 173 days.

(21) Appl. No.: 17/372,205

(22) Filed: Jul. 9, 2021

(65) Prior Publication Data

US 2022/0028936 A1    Jan. 27, 2022

(30) Foreign Application Priority Data

Jul. 23, 2020 (KR) .................. 10-2020-0091747

(51) Int. Cl.
    *H01L 21/00*      (2006.01)
    *H10K 59/121*      (2023.01)
    *H10K 59/131*      (2023.01)
    *H10K 59/35*      (2023.01)

(52) U.S. Cl.
CPC ......... *H10K 59/121* (2023.02); *H10K 59/131* (2023.02); *H10K 59/352* (2023.02); *H10K 59/353* (2023.02)

(58) Field of Classification Search
CPC .................................................. H10K 59/121
See application file for complete search history.

(56) References Cited

U.S. PATENT DOCUMENTS

| | | | |
|---|---|---|---|
| 9,865,668 B2 | 1/2018 | Sato | |
| 2021/0193688 A1 | 6/2021 | Shin et al. | |
| 2021/0399081 A1* | 12/2021 | Park | H10K 59/353 |
| 2022/0028957 A1* | 1/2022 | Park | H10K 59/1213 |

FOREIGN PATENT DOCUMENTS

| | | |
|---|---|---|
| KR | 10-1838378 B1 | 3/2018 |
| KR | 10-2020-0038389 A | 4/2020 |

* cited by examiner

*Primary Examiner* — Douglas M Menz
(74) *Attorney, Agent, or Firm* — Seed IP Law Group LLP

(57) ABSTRACT

A transparent display device may have high transmittance and at the same time embody high resolution. Moreover, the transparent display device may provide optimal picture quality. The transparent display device comprises a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a pixel disposed in an intersection or overlapping area where the first signal line and the second signal line cross or overlap each other, including a first subpixel emitting light of a first color, a second subpixel emitting light of a second color, and a third subpixel emitting light of a third color. The pixel includes a first pixel overlapped with a part of the first signal line of an odd row and a second pixel overlapped with a part of the first signal line of an even row, and the first pixel and the second pixel are different from each other in a position of at least one of the first subpixel, the second subpixel or the third subpixel.

19 Claims, 6 Drawing Sheets

FIG. 7A

| | Pixel structure |
|---|---|
| Case1 | |
| Case2 | |

FIG. 7B

| | Sub-Pixel interval | Pixel structure (arcmin @ 167PPI, viewing distance 60cm) | | | | |
|---|---|---|---|---|---|---|
| | | horizontal | vertical | diagonal | minimum | maximum |
| Case1 | R to R | 0.88 | 0.39 | 0.93 | 0.39 | 1.39 |
| | G to G | 1.10 | 0.84 | 1.39 | | |
| | B to B | 1.10 | 0.83 | 1.12 | | |
| Case2 | R to R | 0.88 | 0.39 | 1.07 | 0.39 | 1.11 |
| | G to G | 1.10 | 0.59 | 0.93 | | |
| | B to B | 1.10 | 0.83 | 1.11 | | |

TRANSPARENT DISPLAY DEVICE

CROSS REFERENCE TO RELATED APPLICATIONS

This application claims the benefit of the Korean Patent Application No. 10-2020-0091747 filed on Jul. 23, 2020, which is hereby incorporated by reference as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device may have high light transmittance in a display area through a transmissive area. However, the resolution of the transparent display device may be deteriorated due to the transmissive area.

BRIEF SUMMARY

The inventors of the present disclosure have recognized that the transparent display device has a problem in that the higher resolution is, more reduced transmittance is. Also, since a spaced distance between subpixels is increased due to the transmissive area in the transparent display device, an interval between the subpixels may be recognized or noticed by a user, whereby picture quality may be degraded.

The present disclosure has been made in view of various technical problems including the above problems, and various embodiments of the present disclosure provide a transparent display device that may improve transmittance and at the same time embody high resolution.

One or more embodiments of the present disclosure provide a transparent display device that prevents an interval between subpixels from being recognized and has optimal picture quality.

Embodiments of the present disclosure provide a transparent display device that may improve definition of picture quality.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other benefits can be accomplished by the provision of a transparent display device comprising a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a pixel disposed in an intersection or overlapping area where the first signal line and the second signal line cross or overlap each other, including a first subpixel emitting light of a first color, a second subpixel emitting light of a second color, and a third subpixel emitting light of a third color. The pixel includes a first pixel overlapped with a part of the first signal line of an odd row and a second pixel overlapped with a part of the first signal line of an even row, and the first pixel and the second pixel are different from each other in a position of at least one of the first subpixel, the second subpixel or the third subpixel.

In accordance with another aspect of the present disclosure, the above and other benefits can be accomplished by the provision of a transparent display device comprising a first non-transmissive area and a second non-transmissive area extended in a first direction and disposed to be spaced apart from each other, a third non-transmissive area and a fourth non-transmissive area extended in a second direction and disposed to be spaced apart from each other, a transmissive area provided between the first non-transmissive area and the second non-transmissive area and between the third non-transmissive area and the fourth non-transmissive area, a first pixel disposed in an intersection or overlapping area where each of the third non-transmissive area and the fourth non-transmissive area crosses or overlaps the first non-transmissive area, and a second pixel disposed in an intersection or overlapping area where each of the third non-transmissive area and the fourth non-transmissive area crosses or overlaps the second non-transmissive area. Each of the first pixel and the second pixel includes a first subpixel emitting light of a first color, a second subpixel emitting light of a second color and a third subpixel emitting light of a third color, and at least one of the first subpixel, the second subpixel or the third subpixel has different shapes and positions in the first pixel and the second pixel.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which:

FIGS. 7a and 7b are views illustrating a pixel structure and a viewing angle in each of Embodiment 1 and Embodiment 2.

DETAILED DESCRIPTION

Figure 1:
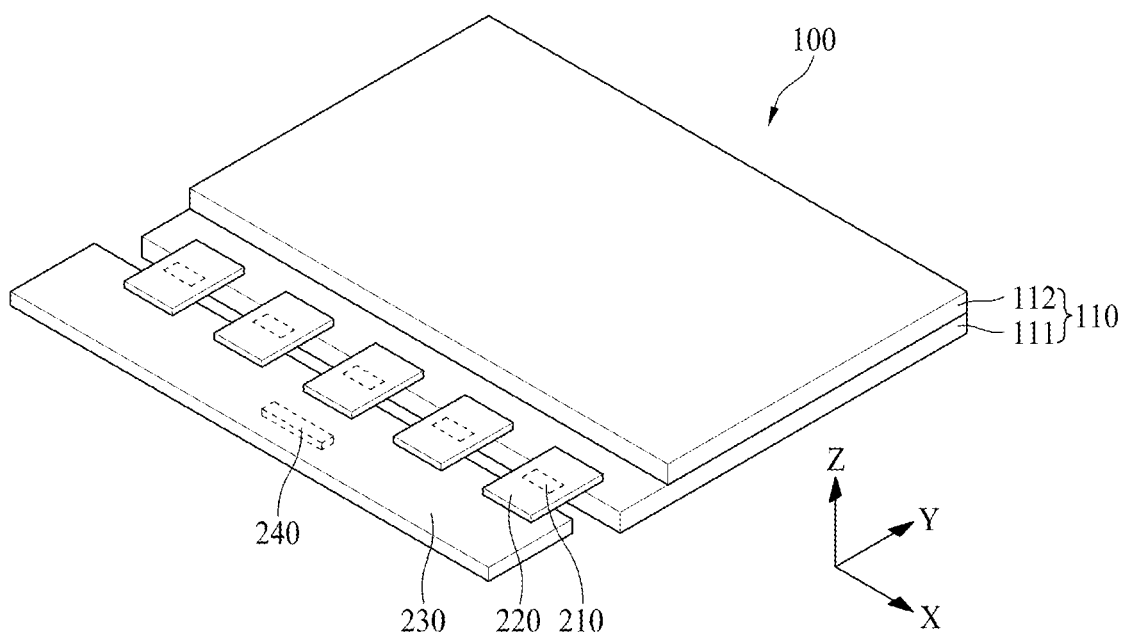
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
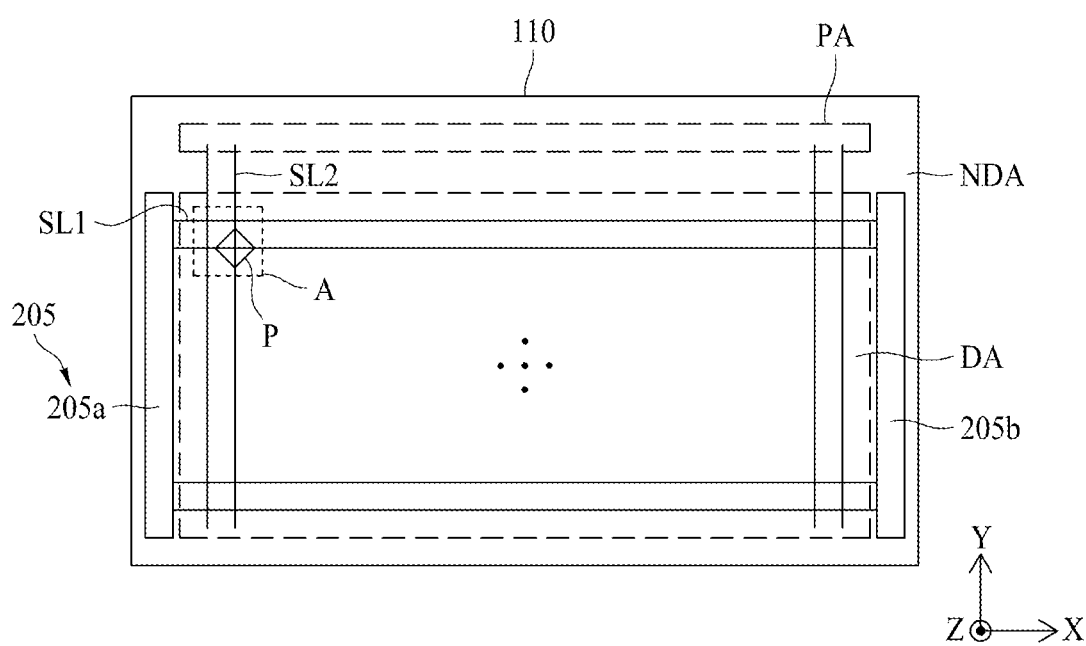
FIG. 2 is a schematic plane view illustrating a transparent display panel.

FIG. 1 is a perspective view illustrating a transparent display device according to one embodiment of the present disclosure, and FIG. 2 is a schematic plane view illustrating a transparent display panel, Hereinafter, X-axis indicates a line parallel with a gate line, Y-axis indicates a line parallel with a data line, and Z-axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED), or an Electrophoresis display device.

Referring to FIG. 1 and FIG. 2, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The substrate 111 may include a display area DA where pixels P are formed to display an image, and a non-display area NDA that does not display an image.

The display area DA may be provided with first signal lines SL1, second signal lines SL2 and pixels P, and the non-display area NDA may be provided with a pad area PA for pads and a gate driver 205.

The first signal lines SL1 may be extended in a first direction (e.g., X-axis direction), and may cross the second signal lines SL2 in the display area DA. The second signal lines SL2 may be extended in a second direction (e.g., Y-axis direction). The pixels P may be provided in an area where the first signal lines SL1 and the second signal lines SL2 intersect or overlap, and emit predetermined or selected light to display an image.

The gate driver 205 supplies gate signals to the gate lines in accordance with a gate control signal which is provided from the timing controller 240. The gate driver 205 may be provided in one side of the display area of the transparent display panel 110, or the non-display area of both peripheral sides of the transparent display panel 110 by a gate driver in panel (GIP) method. In another way, the gate driver 205 may be manufactured in a driving chip, may be mounted on the flexible film, and may be attached to one peripheral side or both peripheral sides of the display area of the transparent display panel 110 by a tape automated bonding (TAB) method.

For example, the gate driver 205, as shown in FIG. 2, may include a first gate driver 205a provided in the non-display area NDA disposed over a first peripheral side of the display area DA, and a second gate driver 205b provided in the non-display area NDA disposed over a second peripheral side of the display area DA, but is not limited thereto.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 3:
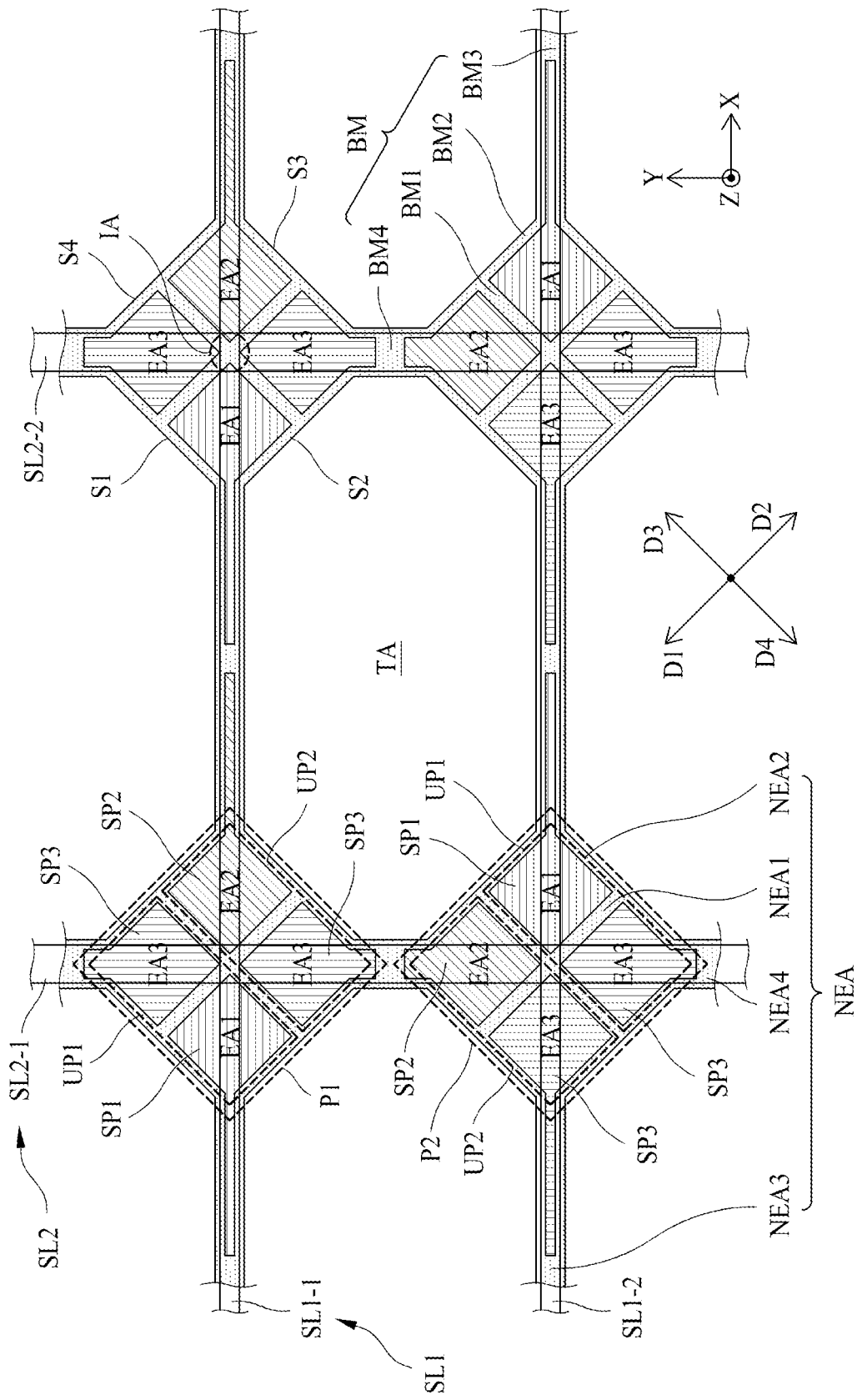
FIG. 3 is a schematic view illustrating one embodiment of a pixel provided in an area A of FIG. 2.
Figure 4:
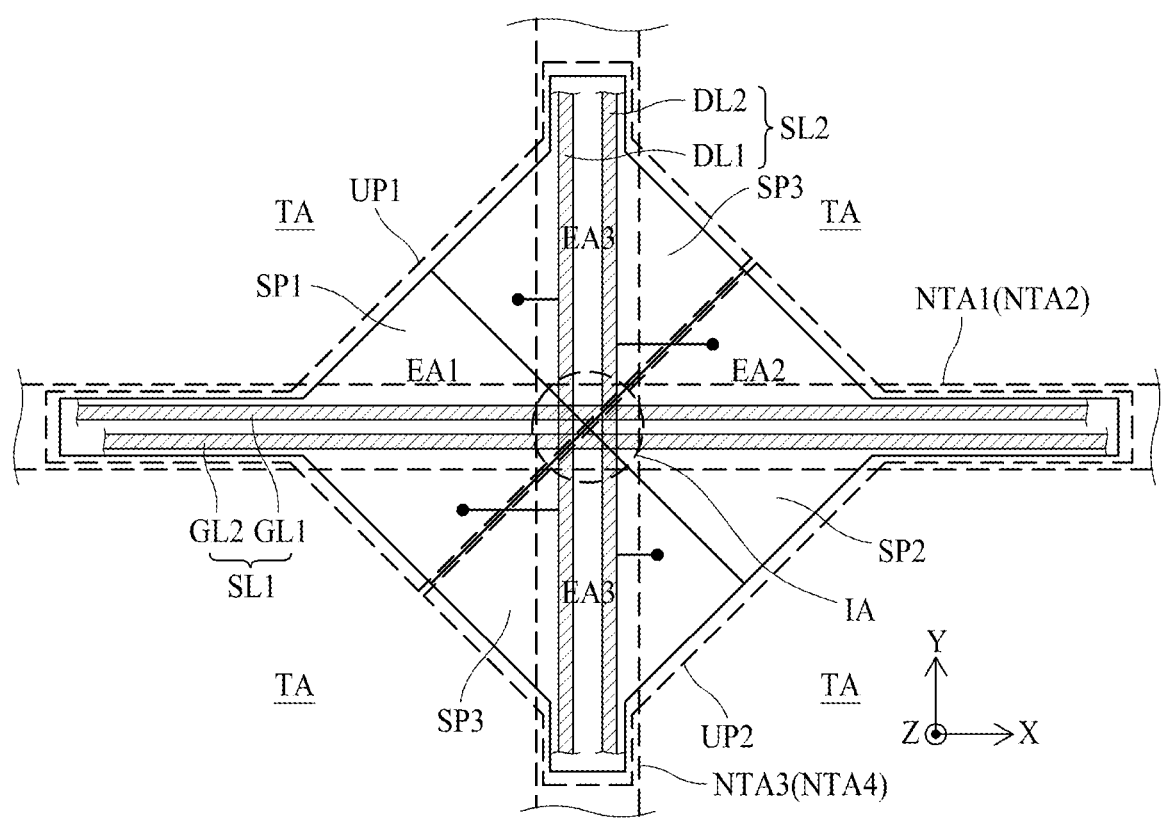
FIG. 4 is a schematic view illustrating a first signal line, a second signal line and a pixel.
Figure 5:
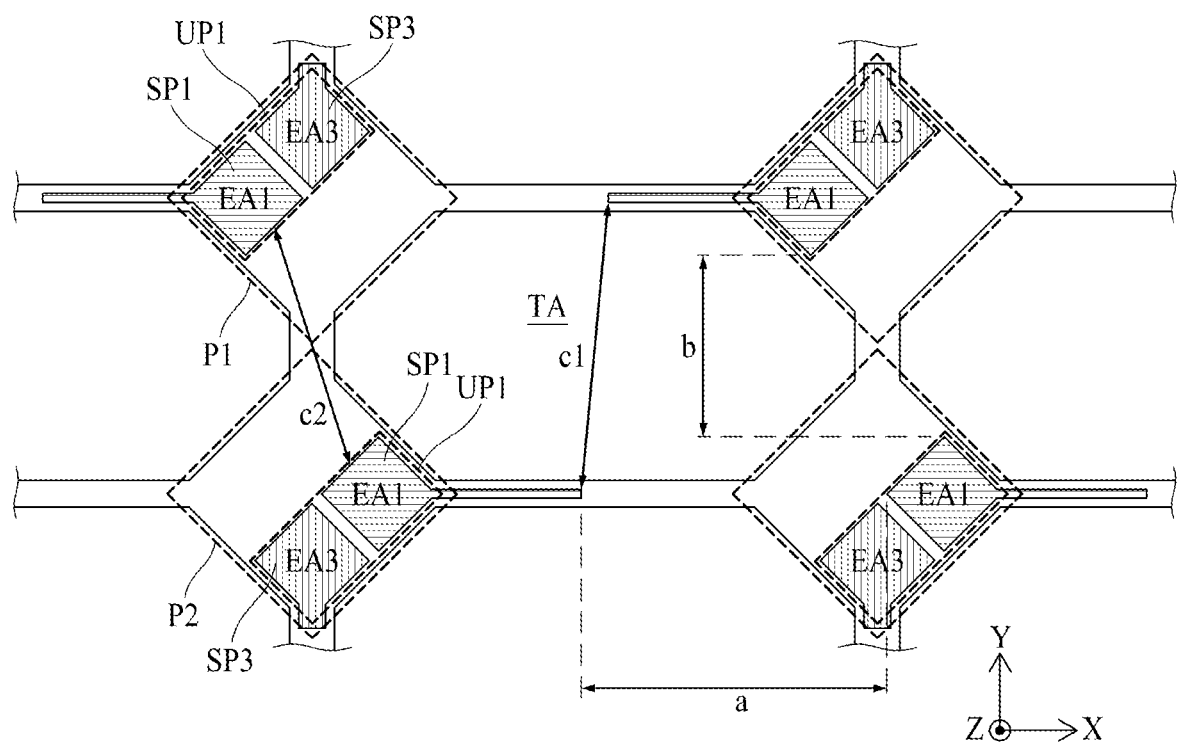
FIG. 5 is a view illustrating arrangement of subpixels included in a first unit pixel.
Figure 6:
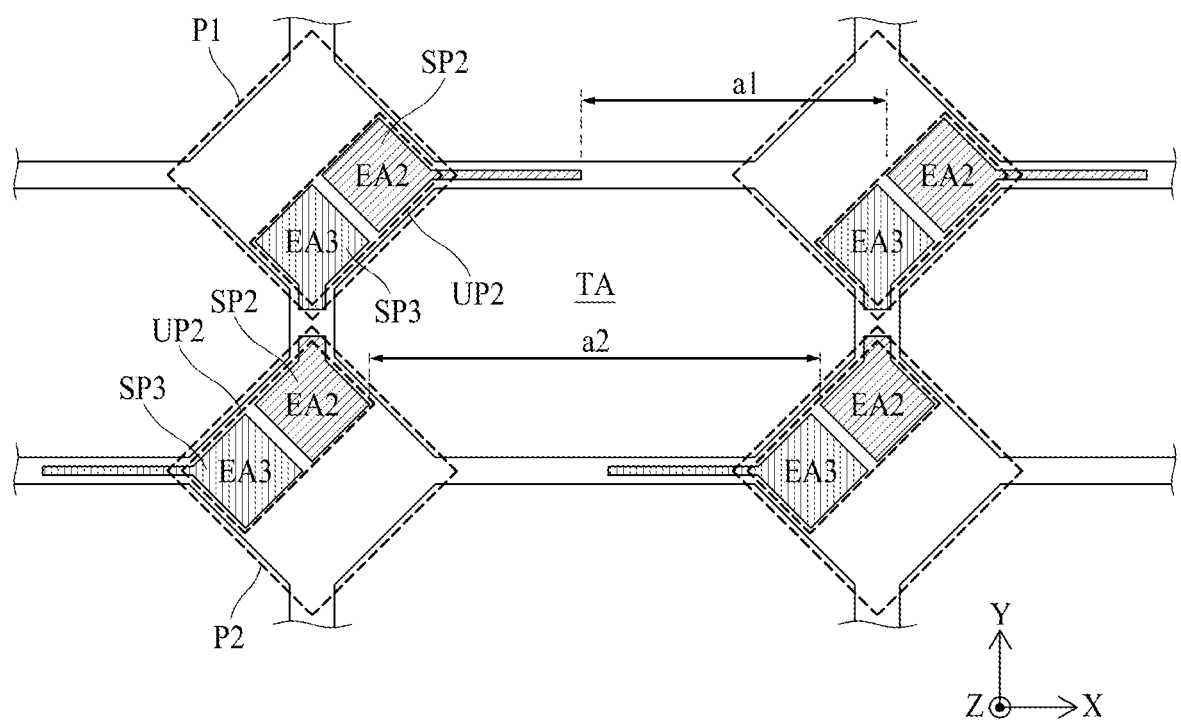
FIG. 6 is a view illustrating arrangement of subpixels included in a second unit pixel.

FIG. 3 is a schematic view illustrating one embodiment of a pixel provided in an area A of FIG. 2, FIG. 4 is a schematic view illustrating a first signal line, a second signal line and a pixel, FIG. 5 is a view illustrating arrangement of subpixels included in a first unit pixel, and FIG. 6 is a view illustrating arrangement of subpixels included in a second unit pixel.

Referring to FIG. 3 to FIG. 6, a transparent display panel 110 may include a display area DA provided with pixels P to display an image, and a non-display area NDA for not displaying an image.

The display area DA includes a transmissive area TA and a non-transmissive area. The transmissive area TA is an area through which most of externally incident light passes, and the non-transmissive area is an area through which most of externally incident light fails to transmit. For example, the transmissive area TA may be an area where light transmittance is greater than α %, for example, 90%, and the non-transmissive area may be an area where light transmittance is smaller than β %, for example, 50%. At this time, α is greater than β. A user may view an object or background arranged over a rear surface of the transparent display panel 110 due to the transmissive area TA.

A non-transmissive area may include first and second non-transmissive areas NTA1 and NTA2 in which a first signal line SL1 is disposed, third and fourth non-transmissive areas NTA3 and NTA4 in which a second signal line SL2 is disposed, and a pixel P.

The first signal lines SL1 may be extended from the display area DA in a first direction (e.g., X-axis direction). The plurality of first signal lines SL1 may be disposed to be spaced apart from one another.

For example, the first signal lines SL1 may include gate lines. In this case, the first signal line SL1 may include two gate lines as shown in FIG. 4. For example, the first signal line SL1 may include a first gate line GL1 for supplying a gate signal to a plurality of subpixels SP1 and SP3 included in a first unit pixel UP1 and a second gate line GL2 for supplying a gate signal to a plurality of subpixels SP2 and SP3 included in a second unit pixel UP2.

Hereinafter, when the first signal line SL1 includes a plurality of lines, one first signal line SL1 may mean a signal line group comprised of a plurality of lines. For example, when the first signal line SL1 includes first and second gate lines GL1 and GL2, one first signal line SL1 may mean a signal line group comprised of first and second gate lines GL1 and GL2.

The second signal lines SL2 may be extended from the display area DA in a second direction (e.g., Y-axis direction), and may cross or overlap the first signal lines SL1 in the display area DA. The plurality of second signal lines SL2 may be disposed to be spaced apart from one another.

For example, the second signal lines SL2 may include data lines. In this case, the second signal line SL2 may include two data lines as shown in FIG. 4. For example, the second signal line SL2 may include a first data line DL1 for supplying a data voltage to the plurality of subpixels SP1 and SP3 included in the first unit pixel UP1, and a second data line DL2 for supplying a data voltage to the plurality of subpixels SP2 and SP3 included in the second unit pixel UP2.

Although not shown in FIG. 4, the second signal line SL2 may further include at least one of a pixel power line, a common power line or a reference line.

Hereinafter, when the second signal line SL2 includes a plurality of lines, one second signal line SL2 may mean a signal line group comprised of a plurality of lines. For example, when the second signal line SL2 includes first and second data lines DL1 and DL2, a pixel power line, a common power line and a reference line, one second signal line SL2 may mean a signal line group comprised of first and second data lines DL1 and DL2, a pixel power line, a common power line and a reference line.

The pixel power line may supply a first power source to a driving transistor of each of the subpixels SP1, SP2 and SP3 provided in the display area DA. The common power line may supply a second power source to a cathode electrode of the subpixels SP1, SP2 and SP3 provided in the display area DA. At this time, the second power source may be a common power source commonly supplied to the subpixels SP1, SP2 and SP3. The reference line may supply an initialization voltage (or sensing voltage) to a driving transistor of each of the subpixels SP1, SP2 and SP3 provided in the display area DA.

A transmissive area TA may be disposed between the first signal lines SL1 adjacent to each other. Also, the transmissive area TA may be disposed between the first non-transmissive area NTA1 provided with a first signal line SL1-1 of an odd row and the second non-transmissive area NTA2 provided with a first signal line SL1-2 of an even row. That is, the transmissive area TA may be disposed between the first signal line SL1-1 of an odd row and the first signal line SL1-2 of an even row.

The transmissive area TA may be disposed between the second signal lines SL2 adjacent to each other. In detail, the transmissive area TA may be disposed between the third non-transmissive area NTA3 provided with a second signal line SL2-1 of an odd column and the fourth non-transmissive area NTA4 provided with a second signal line SL2-2 of an even column. That is, the transmissive area TA may be disposed between the second signal line SL2-1 of an odd column and the second signal line SL2-2 of an even column. The transmissive area TA may be surrounded by two first signal lines SL1-1 and SL1-2 and two second signal lines SL2-1 and SL2-2.

A length in a first direction of the transmissive area TA may be longer than a length in a second direction of the transmissive area TA. The first signal line SL1 extended in the first direction may have a width smaller or narrower than that of the second signal line SL2 extended in the second direction. The first signal line SL1 includes gate lines GL1 and GL2, whereas the second signal line SL2 may include one of the pixel power line and the common power line in addition to the data lines DL1 and DL2. Since a high voltage is applied to the pixel power line and the common power line, each of the pixel power line and the common power line should have a width wider than that of each of the gate lines GL1 and GL2 or the data lines DL2 and DL2. Therefore, the second signal line SL2 may have a width wider than that of the first signal line SL1.

The transparent display panel 110 according to one embodiment of the present disclosure may improve transmittance by increasing a size of one transmissive area TA. When the size of one transmissive area TA is increased, a length of at least one of the first signal line SL1 or the second signal line SL2, which surrounds one transmissive area TA, may also be increased.

When the length in the second direction of the transmissive area TA is formed to be long, the length of the second signal line SL2 disposed between two transmissive areas TA adjacent to each other may be increased. On the other hand, when the length in the first direction of the transmissive area TA is formed to be long, the length of the first signal line SL1 disposed between two transmissive areas TA adjacent to each other may be increased. Since the first signal line SL1 has a width smaller or narrower than that of the second signal line SL2, an increase ratio of an area according to increase of the length is low. Since the area where the first signal line SL1 and the second signal line SL2 are provided corresponds to the non-transmissive area through which light is not transmitted, when the length in the first direction of the transmissive area TA is increased, a size increase ratio of the non-transmissive area is smaller than the case that the length in the second direction of the transmissive area is increased.

Therefore, the transparent display panel 110 according to one embodiment of the present disclosure may increase the size of the transmissive area TA and improve transmittance by increasing the length in the first direction of the transmissive area TA.

The pixels P are provided in the intersection or overlapping area IA where the first signal line SL1 the second signal line SL2 cross or overlap each other, and display an image by emitting predetermined or selected light. An emission area EA may correspond to an area for emitting light in the pixel P.

The pixel P, as shown in FIG. 3, may include a first pixel P1 overlapped with a part of the first signal line SL1-1 of an odd row and a second pixel P2 overlapped with a part of the first signal line SL1-2 of an even row.

The first pixel P1 may be provided in the intersection or overlapping area where the first non-transmissive area NTA1 provided with the first signal line SL1-1 of the odd row and the third non-transmissive area NTA3 provided with the second signal line SL2-1 of the odd column cross or overlap each other. Also, the first pixel P1 may be provided in the intersection or overlapping area where the first non-transmissive area NTA1 provided with the first signal line SL1-1 of the odd row and the fourth non-transmissive area NTA4 provided with the second signal line SL2-2 of the even column cross or overlap each other. Since the arrangement order of the subpixels SP1, SP2 and SP3 of the first pixel P1 overlapped with a part of the second signal line SL2-1 of the odd column is equal to that of the subpixels SP1, SP2 and SP3 of the second pixel P2 overlapped with a part of the second signal line SL2-2 of the even column, a description may be based on that the first pixel P1 is disposed in the intersection or overlapping area where the first signal line SL1-1 of the odd row and the second signal line SL2 cross or overlap each other.

The second pixel P2 may be provided in the intersection or overlapping area where the second non-transmissive area NTA2 provided with the first signal line SL1-2 of the even row and the third non-transmissive area NTA3 provided with the second signal line SL2-1 of the odd column cross or overlap each other. Also, the second pixel P2 may be provided in the intersection or overlapping area where the second non-transmissive area NTA2 provided with the first signal line SL1-2 of the even row and the fourth non-transmissive area NTA4 provided with the second signal line SL2-2 of the even column cross or overlap each other. Since the arrangement order of the subpixels SP1, SP2 and SP3 of the second pixel P2 overlapped with a part of the second signal line SL2-1 of the odd column is equal to that of the subpixels SP1, SP2 and SP3 of the second pixel P2 overlapped with a part of the second signal line SL2-2 of the even column, a description may be based on that the second pixel P2 is disposed in the intersection or overlapping area where the first signal line SL1-2 and the second signal line SL2 of the even column cross or overlap each other.

Each of the first pixel P1 and the second pixel P2 may include a first unit pixel UP1 and a second unit pixel UP2. That is, in the transparent display panel 110 according to one embodiment of the present disclosure, two unit pixels UP1 and UP2 may be provided in the intersection or overlapping area IA where the first signal line SL1 and the second signal line SL2 cross or overlap each other.

In the transparent display panel 110 according to one embodiment of the present disclosure, as two unit pixels UP1 and UP2 are provided in one intersection or overlapping area, the size of the transmissive area TA may be increased, whereby transmittance may be improved and at the same time high resolution may be obtained.

Each of the first unit pixel UP1 and the second unit pixel UP2 may include at least two of the first subpixel SP1, the second subpixel SP2 and the third subpixel SP3. In this case, one of the first subpixel SP1, the second subpixel SP2 and the third subpixel SP3 may be disposed to be repeated in the first unit pixel UP1 and the second unit pixel UP2.

For example, the second subpixel SP2 may be disposed to be repeated in the first unit pixel UP1 and the second unit pixel UP2. That is, the first unit pixel UP1 may include the first subpixel SP1 and the third subpixel SP3, and the second unit pixel UP2 may include the second subpixel SP2 and the third subpixel SP3.

The first subpixel SP1 may include a first emission area EA1 emitting light of a first color, the second subpixel SP2 may include a second emission area EA2 emitting light of a second color, and the third subpixel SP3 may include a third emission area EA3 emitting light of a third color.

As an example, the first to third emission areas EA1, EA2 and EA3 may emit light of respective colors different from one another. For example, the first emission area EA1 may emit green light, the second emission area EA2 may emit blue light, and the third emission area EA3 may emit red light. However, the emission areas are not limited to this example. Also, the arrangement order of the subpixels SP1, SP2 and SP3 may be changed in various ways.

Hereinafter, for convenience of description, the description will be based on that the first subpixel SP1 is a green subpixel for emitting green light, the second subpixel SP2 is a blue subpixel for emitting blue light, and the third subpixel SP3 is a red subpixel for emitting red light. Also, although the description is based on that the first unit pixel UP1 includes the first subpixel SP1 and the third subpixel SP3 and the second unit pixel UP2 includes the second subpixel SP2 and the third subpixel SP3, the present disclosure is not limited to this example.

In the transparent display panel 110 according to one embodiment of the present disclosure, the arrangement order of the first to third subpixels SP1, SP2 and SP3 in the first pixel P1 is different from that of the first to third subpixels SP1, SP2 and SP3 in the second pixel P2. The first pixel P1 and the second pixel P2 may be different from each other in a position of at least one of the first subpixel SP1, the second subpixel SP2 or the third subpixel SP3.

In detail, the first pixel P1 and the second pixel P2 are different from each other in the positions of the first unit pixel UP1 and the second unit pixel UP2. In the first pixel P1, the first unit pixel UP1 may be disposed in a first direction (e.g., direction D1) based on the intersection or overlapping area IA, and the second unit pixel UP2 may be disposed in a second direction (e.g., direction D2) opposite to the first direction (e.g., direction D1). On the other hand, in the second pixel P2 unlike the first pixel P1, the first unit pixel UP1 may be disposed in the second direction (e.g., direction D2) based on the intersection or overlapping area IA, and the second unit pixel UP2 may be disposed in the first direction (e.g., direction D1).

Meanwhile, the first subpixel SP1 and the third subpixel SP3, which are included in the first unit pixel UP1, may be different from each other in the arrangement order in the first pixel P1 and the second pixel P2. Therefore, the first subpixel SP1 and the third subpixel SP3, which are included in the first unit pixel UP1, may be different from each other in their positions and shapes in the first pixel P1 and the second pixel P2.

In detail, each of the first pixel P1 and the second pixel P2 may be provided with four subpixels areas based on the intersection or overlapping area IA such that four subpixels may be disposed in the four subpixel areas. Each of the first pixel P1 and the second pixel P2 may include a first subpixel area overlapped with a part of the first signal line SL1, a second subpixel area overlapped with a part of the second signal line SL2, a third subpixel area overlapped with a part of the first signal line SL1, facing the first subpixel area, and a fourth subpixel area overlapped with a part of the second signal line SL2, facing the second subpixel area.

In the first pixel P1, the first unit pixel UP1 may be disposed in the first direction (e.g., direction D1) based on the intersection or overlapping area IA. The first subpixel SP1 included in the first unit pixel UP1 of the first pixel P1 may be disposed over the first signal line SL1-1 of the odd row. The first subpixel SP1 included in the first unit pixel UP1 of the first pixel P1 may be provided in the first subpixel area of the first pixel P1. In one embodiment, the first subpixel SP1 included in the first unit pixel UP1 of the first pixel P1 may include a protrusion area protruded along the first signal line SL1-1 in a direction of a first side.

The third subpixel SP3 included in the first unit pixel UP1 of the first pixel P1 may be disposed over the second signal line SL2. The third subpixel SP3 included in the first unit pixel UP1 of the first pixel P1 may be provided in the second subpixel area of the first pixel P1. In one embodiment, the third subpixel SP3 included in the first unit pixel UP1 of the first pixel P1 may include a protrusion area protruded along the second signal line SL2 in a direction of a second side.

In the second pixel P2, the first unit pixel UP1 may be disposed in the second direction (e.g., direction D2) based on the intersection or overlapping area IA unlike the first pixel P1. The first subpixel SP1 included in the first unit pixel UP1 of the second pixel P2 may be disposed over the first signal line SL1-2 of the even row. The first subpixel SP1 included in the first unit pixel UP1 of the second pixel P2 may be provided in the third subpixel area of the second pixel P2, unlike the first pixel P1. In one embodiment, the first subpixel SP1 included in the first unit pixel UP1 of the second pixel P2 may include a protrusion area protruded along the first signal line SL1-2 in a direction of a third side opposite to the direction where the first subpixel SP1 of the first pixel P1 is protruded.

The third subpixel SP3 included in the first unit pixel UP1 of the second pixel P2 may be disposed over the second signal line SL2. The third subpixel SP3 included in the first unit pixel UP1 of the second pixel P2 may be provided in the fourth subpixel area of the second pixel P2 unlike the first pixel P1. In one embodiment, the third subpixel SP3 included in the first unit pixel UP1 of the second pixel P2 may include a protrusion area protruded along the second signal line SL2 in a direction of a second side.

When the first unit pixel UP1 of the first pixel P1 and the first unit pixel UP1 of the second pixel P2 have the arrangement order described as above, diagonal lengths c1 and c2 of the first subpixel SP1 of the first pixel P1 and the first subpixel SP1 of the second subpixel P2 may be longer than vertical lengths 'b' of the first subpixel SP1 of the first pixel P1 and the first subpixel SP1 of the second pixel P2, as shown in FIG. 5. Also, the diagonal lengths c1 and c2 of the first subpixel SP1 of the first pixel P1 and the first subpixel SP1 of the second subpixel P2 may be shorter than horizontal lengths 'a' of the first subpixel SP1 of the first pixel P1 and the first subpixel SP1 of the second pixel P2.

When the first subpixel SP1 is a green subpixel, green light may have luminance greater than that of each of red light and blue light. The transparent display panel 110 according to one embodiment of the present disclosure may embody optimal picture quality by uniformly disposing green subpixels of high luminance.

The first pixel P1 and the second pixel P2 may be the same as each other in positions of the first unit pixel UP1 and the second unit pixel UP2, and may be the same as each other in the arrangement order of the first subpixel SP1 and the third subpixel SP3, which are included in the first unit pixel UP1. Since the first subpixel SP1 is disposed in the same position in each of the first pixel P1 and the second pixel P2, the first subpixel SP1 may be disposed in a line in parallel with the second signal line SL2 or the first signal line SL1. In this case, green subpixels may be recognized from an image as a line. When the green subpixel has high luminance, a line comprised of green subpixels may easily be recognized.

In the transparent display panel 110 according to one embodiment of the present disclosure, the first subpixel SP1 may be disposed in different positions in the first pixel P1 and the second pixel P2. In the first pixel P1, the first subpixel SP1 may be disposed in the first subpixel area, and in the second pixel P2, the first subpixel SP1 may be disposed in the third subpixel area, which is provided to face the first subpixel area, instead of the first subpixel area. Therefore, in the transparent display panel 110 according to one embodiment of the present disclosure, since the first subpixel SP1 is not disposed in a line in parallel with the second signal line SL2, the first subpixel SP1 may not be recognized from an image as a line.

Meanwhile, the first subpixel SP1 of the first pixel P1 may include a protrusion area protruded along the first signal line SL1-1 in a direction of a first side, and the first subpixel SP1 of the second pixel P2 may include a protrusion area protruded along the first signal line SL1-2 in a direction of a third side opposite to the direction where the first subpixel SP1 of the first pixel P1 is protruded.

In the transparent display panel 110 according to one embodiment of the present disclosure, each of the first subpixel SP1 of the first pixel P1 and the first subpixel SP1 of the second pixel P2 is protruded along the first signal line SL1, whereby an emission area of the first subpixel SP1 may be increased and the size of the non-emission area NEA may be reduced. Therefore, the transparent display panel 110 according to one embodiment of the present disclosure may improve emission efficiency.

Also, in the transparent display panel 110 according to one embodiment of the present disclosure, the protrusion areas respectively provided in the first subpixel SP1 of the first pixel P1 and the first subpixel SP1 of the second pixel P2 are provided in their respective directions different from each other, whereby the first subpixels SP1 may be disposed more uniformly.

The first pixel P1 and the second pixel P2 may be different from each other in the arrangement order of the second subpixel SP2 and the third subpixel SP3, which are included in the second unit pixel UP2 as well as the first unit pixel UP1. Therefore, the second subpixel SP2 and the third subpixel SP3, which are included in the second unit pixel UP2, may be different from each other in their positions and shapes in the first pixel P1 and the second pixel P2.

In detail, in the first pixel P1, the second unit pixel UP2 may be disposed in the second direction (e.g., direction D2) based on the intersection or overlapping area IA. The second subpixel SP2 included in the second unit pixel UP2 of the first pixel P1 may be disposed over the first signal line SL1-1 of the odd row. The second subpixel SP2 included in the second unit pixel UP2 of the first pixel P1 may be provided in the third subpixel area of the first pixel P1. In one embodiment, the second subpixel SP2 included in the second unit pixel UP2 of the first pixel P1 may include a protrusion area protruded along the first signal line SL1-1 in a direction of a third side opposite to the direction where the first subpixel SP1 of the first unit pixel UP1 is protruded.

The third subpixel SP3 included in the second unit pixel UP2 of the first pixel P1 may be disposed over the second signal line SL2. The third subpixel SP3 included in the second unit pixel UP2 of the first pixel P1 may be provided in the fourth subpixel area of the first pixel P1. In one embodiment, the third subpixel SP3 included in the second unit pixel UP2 of the first pixel P1 may include a protrusion area protruded along the second signal line SL2 in a direction of a second side opposite to the direction where the third subpixel SP3 of the first unit pixel UP1 is protruded.

In the second pixel P2, the second unit pixel UP2 may be disposed in the first direction (e.g., direction D1) based on the intersection or overlapping area IA unlike the first pixel P1. The second subpixel SP2 included in the second unit pixel UP2 of the second pixel P2 may be disposed over the second signal line SL2 not the first signal line unlike the first pixel P1. The second subpixel SP2 included in the second unit pixel UP2 of the second pixel P2 may be provided in the second subpixel area of the second pixel P2, unlike the first pixel P1. In one embodiment, the second subpixel SP2 included in the second unit pixel UP2 of the second pixel P2 may include a protrusion area protruded along the second signal line SL2 in a direction of a second side.

The third subpixel SP3 included in the second unit pixel UP2 of the second pixel P2 may be disposed over the first signal line SL1-2 of the even row not the second signal line SL2 unlike the first pixel P1. The third subpixel SP3 included in the second unit pixel UP2 of the second pixel P2 may be provided in the first subpixel area of the second pixel P2 unlike the first pixel P1. In one embodiment, the third subpixel SP3 included in the second unit pixel UP2 of the second pixel P2 may include a protrusion area protruded along the first signal line SL1-2 of the even row in a direction of a first side. The third subpixel SP3 included in the second unit pixel UP2 of the second pixel P2 may be disposed in parallel with the first subpixel SP1 of the first unit pixel UP1 of the first pixel P1.

When the second unit pixel UP2 of the first pixel P1 and the second unit pixel UP2 of the second pixel P2 have the arrangement order described as above, a horizontal length a1 between two of the second subpixels SP2 of the first pixel P1, which are adjacent to each other, may be different from a horizontal length a2 between two of the second subpixels SP2 of the second subpixel P2, which are adjacent to each other. In detail, the horizontal length a1 between the second subpixels SP2 of the first pixel P1, which are adjacent to each other, may be longer than the horizontal length a2 between two of the second subpixels SP2 of the second pixel P2, which are adjacent to each other.

Each of the first pixel P1 and the second pixel P2 may include two third subpixels SP3. In the first pixel P1, two third subpixels SP3 may be disposed to face each other along the second signal line SL2. In the second pixel P2, one of two third subpixels SP3 may be disposed over the first signal line SL1, and the other one may be disposed over the second signal line SL2. In the transparent display panel 110 according to one embodiment of the present disclosure, the third subpixels SP3 are disposed differently in the first pixel P1 and the second pixel P2, whereby the third subpixels SP3 may be prevented from being recognized from an image as a line.

Two third subpixels SP3 may be disposed to face each other along the second signal line SL2 in both the first pixel P1 and the second pixel P2. In this case, since the third subpixels SP3 are disposed in a line along the second signal line, the third subpixels SP3 may be recognized from an image as a line. Since a spaced distance between the second signal lines SL2 is greater than that between the first signal lines SL1, a line comprised of the third subpixels SP3 may be recognized more easily.

In the transparent display panel 110 according to one embodiment of the present disclosure, the third subpixels SP3 may be disposed differently in the first pixel P1 and the second pixel P2, whereby the third subpixels SP3 may be prevented from being disposed in a line along the second signal line SL2. Therefore, the transparent display panel 110 according to one embodiment of the present disclosure may prevent the third subpixels SP3 from being recognized from an image as a line.

In the transparent display panel 110 according to one embodiment of the present disclosure, the subpixels SP1, SP2 and SP3 provided in each of the first pixel P1 provided over the first signal line SL1-1 of the add row and the second pixel P2 provided over the first signal line SL1-2 of the even row may be disposed differently as described above. The transparent display panel 110 provided with the first pixel P1 and the second pixel P2 as described above may have high transmittance and at the same time have high resolution, and moreover may provide optimal picture quality.

Meanwhile, in the transparent display panel 110 according to one embodiment of the present disclosure, the pixel P includes a plurality of sides oriented toward the transmissive area, and each of the plurality of sides of the pixel P has an inclination with respect to each of the first signal line SL1 and the second signal line SL2.

In detail, the pixel P may include first and second sides S1 and S2 oriented toward the transmissive area TA, a third side S3 facing the first side S1, and a fourth side S4 facing the second side S2. For example, the pixel P may have a protrusion area protruded along the first signal line SL1 in a rhombus shape comprised of four sides S1, S2, S3 and S4. In this case, the transmissive area TA may have a hexagonal shape or an octagonal shape in accordance with a size and arrangement of the pixel P.

Each of the first side S1, the second side S2, the third side S3 and the fourth side S4 of the pixel P may be inclined without being parallel with or vertical to the first signal line SL1. That is, each of the first side S1, the second side S2, the third side S3 and the fourth side S4 of the pixel P may have an inclination of 0° to 90° with respect to the first signal line SL1. For example, each of the first side S1, the second side S2, the third side S3 and the fourth side S4 of the pixel P may be comprised of an oblique line having an inclination of 30° to 60° with respect to the first signal line SL1.

Also, each of the first side S1, the second side S2, the third side S3 and the fourth side S4 of the pixel P may be inclined without being parallel with or vertical to the second signal line SL2. That is, each of the first side S1, the second side S2, the third side S3 and the fourth side S4 of the pixel P may have an inclination of 0° to 90° with respect to the second signal line SL2. For example, each of the first side S1, the second side S2, the third side S3 and the fourth side S4 of the pixel P may be comprised of an oblique line having an inclination of 30° to 60° with respect to the second signal line SL2.

Meanwhile, the non-transmissive area may be categorized into an emission area EA provided with a pixel P to emit light, and a non-emission area NEA for not emitting light.

The emission area EA may be provided with the plurality of subpixels SP1, SP2 and SP3 to emit light of a predetermined or selected color, and may include a first emission area EA1, a second emission area EA2 and a third emission area EA3, which are respectively provided in the plurality of subpixels SP1, SP2 and SP3.

The non-emission area NEA may be provided with a black matrix BM. The black matrix BM may include a first black matrix BM1, a second black matrix BM2, a third black matrix BM3, and a fourth black matrix BM4.

The first black matrix BM1 may be provided among the plurality of subpixels SP1, SP2 and SP3 to prevent color mixture from occurring among the plurality of subpixels SP1, SP2 and SP3.

The second black matrix BM2 may be provided between each of the plurality of subpixels SP1, SP2 and SP3 and the transmissive area TA to prevent light emitted from each of the plurality of subpixels SP1, SP2 and SP3 from being seen as light of another color depending on a viewing angle.

The third black matrix BM3 may be provided between the pixels P disposed to be adjacent to each other in a first direction, thereby preventing color mixture from occurring between the pixels P disposed to be adjacent to each other in the first direction, and preventing externally incident light from being reflected in the first signal line SL1.

The fourth black matrix BM4 may be provided between the pixels P disposed to be adjacent to each other in a second direction, thereby preventing color mixture from occurring between the pixels P disposed to be adjacent to each other in the second direction, and preventing externally incident light from being reflected in the second signal line SL2.

Since the black matrix BM is made of a material that shields or absorbs light, the light emitted from the subpixels SP1, SP2 and SP3 may not pass through the area where the black matrix BM is provided and the externally incident light may not transmit the area where the black matrix BM is provided. Therefore, the area where the black matrix BM is provided corresponds to the non-emission area NEA from which light is not emitted.

Since the black matrix BM shields or absorbs light, the black matrix BM may greatly affect transmittance of the transparent display panel 110. In detail, transmittance of the transparent display panel 110 may be reduced when the area where the black matrix BM is provided, that is, the non-emission area NEA is increased. On the other hand, transmittance of the transparent display panel 110 may be increased when the non-emission area NEA is reduced.

The transparent display panel 110 according to one embodiment of the present disclosure has a pixel P structure for reducing the area where the black matrix BM is provided, that is, the non-emission area NEA. In the transparent display panel 110 according to one embodiment of the present disclosure, the pixel P is provided in the intersection area IA where the first signal line SL1 and the second signal line SL2 cross each other, and the plurality of sides S1, S2, S3 and S4 of the pixel P are inclined with respect to each of the first signal line SL1 and the second signal line SL2. In the transparent display panel 110 having the pixel P described as above, the plurality of sides S1, S2, S3 and S4 may reduce an outer length of the transmissive area TA as compared with the transparent display panel having a pixel P parallel with or vertical to the first signal line SL1 and the second signal line SL2.

That is, the transparent display panel 110 according to one embodiment of the present disclosure may reduce a total size of the second black matrix BM2 provided between each of the subpixels SP1, SP2 and SP3 and the transmissive area TA, the third black matrix BM3 provided between the pixels P disposed to be adjacent to each other in the first direction and the fourth black matrix BM4 provided between the pixels P disposed to be adjacent to each other in the second direction. Therefore, the transparent display panel 110 according to one embodiment of the present disclosure may improve transmittance as the area where the black matrix BM is provided, that is, the non-emission area NEA is reduced.

Also, in the transparent display panel 110 according to one embodiment of the present disclosure, one pixel P is provided in the intersection area IA where the first signal line SL1 and the second signal line SL2 cross each other, and the pixel P includes the plurality of subpixels SP1, SP2 and SP3 disposed based on the intersection area IA. In the transparent display panel 110 according to one embodiment of the present disclosure, the plurality of subpixels SP1, SP2 and SP3 are together disposed based on the intersection area IA, whereby definition of picture quality and readability may be improved.

Also, in the transparent display panel 110 according to one embodiment of the present disclosure, the first non-emission area NEA1 provided among the plurality of subpixels SP1, SP2 and SP3 may be inclined with respect to each of the first signal line SL1 and the second signal line SL2. For example, the black matrix BM may be provided from the intersection area IA to an intermediate point of each of the sides S1, S2, S3 and S4 of the pixel P. In this way, the transparent display panel 110 provided with the black matrix BM may reduce the first non-emission area NEA1 as compared with the transparent display panel provided with the black matrix BM along the first signal line SL1 or the second signal line SL2 among the plurality of subpixels SP1, SP2 and SP3.

That is, the transparent display panel 110 according to one embodiment of the present disclosure may reduce the size of the first black matrix BM1 provided among the subpixels SP1, SP2 and SP3. Therefore, the transparent display panel 110 according to one embodiment of the present disclosure may improve transmittance as the area where the black matrix BM is provided, that is, the non-emission area NEA is reduced.

FIG. 7a is a view illustrating a pixel structure in each of Embodiment 1 and Embodiment 2.

Referring to FIG. 7a, in Embodiment 1 (Case 1), the arrangement order of the subpixels is different in the pixel provided in the first signal line SL1-1 of the odd row and the pixel provided in the first signal line SL1-2 of the even row.

In this case, the pixel provided in the first signal line SL1-1 of the odd row may be disposed such that one of two red subpixels may face a blue subpixel over the first signal line SL1-1 of the odd row and the other one may face a green subpixel over the second signal line SL2.

The pixel provided in the first signal line SL1-2 of the even row may be disposed such that one of two red subpixels may face a green subpixel over the first signal line SL1-2 of the even row and the other one may face a blue subpixel over the second signal line SL2.

Embodiment 2 (Case 2) illustrates an example of a pixel structure disposed over the transparent display panel 110 according to one embodiment of the present disclosure. In the Embodiment 2 (Case 2), the arrangement order of the subpixels is different in the pixel provided in the first signal line SL1-1 of the odd row and the pixel provided in the first signal line SL1-2 of the even row.

In this case, the pixel provided in the first signal line SL1-1 of the odd row may be disposed such that two red subpixels may face each other over the second signal line SL2, and a green subpixel and a blue subpixel may face each other over the first signal line SL1-1 of the odd row.

The pixel provided in the first signal line SL1-2 of the even row may be disposed such that one of two red subpixels may face a green subpixel over the first signal line SL1-2 of the even row and the other one may face a blue subpixel over the second signal line SL2.

FIG. 7b illustrates a viewing angle in each of Embodiment 1 and Embodiment 2.

Referring to FIG. 7b, a horizontal viewing angle may denote a viewing angle of subpixels of the same color disposed to be adjacent to each other in a horizontal direction, a vertical viewing angle may denote a viewing angle of subpixels of the same color disposed to be adjacent to each other in a vertical direction, and a diagonal viewing angle may denote a viewing angle of subpixels of the same color disposed to be adjacent to each other in a diagonal direction. The viewing angle is 1.5 arcmin or less, and it is preferable that the viewing angle is smaller. When the viewing angle becomes great, an interval between the subpixels may be recognized, whereby picture quality may be degraded.

In the Embodiment 1, it may be noted that a horizontal viewing angle between red subpixels is 0.88 arcmin, a vertical viewing angle is 0.39 arcmin, and a diagonal viewing angle is 0.93 arcmin. In the Embodiment 1, it may be noted that a horizontal viewing angle between green subpixels is 1.10 arcmin, a vertical viewing angle is 0.84 arcmin, and a diagonal viewing angle is 1.39 arcmin. Also, in the Embodiment 1, it may be noted that a horizontal viewing angle between blue subpixels is 1.10 arcmin, a vertical viewing angle is 0.83 arcmin, and a diagonal viewing angle is 1.12 arcmin.

In the transparent display panel 110 having the pixel structure of the Embodiment 1, the diagonal viewing angle between the green subpixels has a maximum value of 1.39 arcmin. This value exceeds 1 arcmin but is 1.5 arcmin or less, and has a low level that recognizes the green subpixels. As a result, the transparent display panel 110 having the pixel structure of the Embodiment 1 may provide good picture quality without generating degradation of picture quality In the Embodiment 2, it may be noted that a horizontal viewing angle between red subpixels is 0.88 arcmin, a vertical viewing angle is 0.39 arcmin, and a diagonal viewing angle is 1.07 arcmin. In the Embodiment 2, it may be noted that a horizontal viewing angle between green subpixels is 1.10 arcmin, a vertical viewing angle is 0.59 arcmin, and a diagonal viewing angle is 0.93 arcmin. Also, in the Embodiment 2, it may be noted that a horizontal viewing angle between blue subpixels is 1.10 arcmin, a vertical viewing angle is 0.83 arcmin, and a diagonal viewing angle is 1.11 arcmin.

In the transparent display panel 110 having the pixel structure of the Embodiment 2, the diagonal viewing angle between the blue subpixels has a maximum value of 1.11 arcmin. This value corresponds to a value that exceeds 1 arcmin but is remarkably lower than 1.5 arcmin. Therefore, in the transparent display panel 110 having the pixel structure of the Embodiment 2, the level that recognizes the blue subpixels is remarkably low.

As a result, the transparent display panel 110 having the pixel structure of the Embodiment 2 may provide good picture quality.

According to the present disclosure, two unit pixels may correspond to one transmissive area. Therefore, the total size of the transmissive area is increased, whereby the transparent display device of the present disclosure may have high transmittance and at the same time have high resolution.

Also, according to the present disclosure, the arrangement order of the subpixels may be different in the first pixel overlapped with a part of the first signal line of an odd row and the second pixel overlapped with a part of the second signal line of an even row. The transparent display device of the present disclosure may have an optimal pixel structure, thereby preventing picture quality from being degraded.

Also, according to the present disclosure, the plurality of subpixels are together disposed based on the intersection area where the first signal line and the second signal line cross each other, whereby definition of picture quality and readability may be improved.

Also, according to the present disclosure, each of the plurality of sides of the pixel may be provided to have an inclination, the outer length of the transmissive area may be minimized. Therefore, according to the present disclosure, the area where the black matrix is provided, that is, the non-emission area may be reduced, and transmittance may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a plurality of first signal lines extended in a first direction and disposed to be spaced apart from one another;
a plurality of second signal lines extended in a second direction and disposed to be spaced apart from one another;

a transmissive area provided between two first signal lines of the plurality of the first signal lines that are adjacent to each other and two second signal lines of the plurality of the second signal lines that are adjacent to each other; and a pixel disposed in areas where one of the first signal lines and one of the second signal lines overlap each other, including a first subpixel emitting light of a first color, a second subpixel emitting light of a second color, and a third subpixel emitting light of a third color, wherein the pixel includes a first pixel overlapped with a part of the first signal line in an odd row and a second pixel overlapped with a part of the first signal line in an even row, and wherein the first pixel and the second pixel are different from each other in a position of at least one of the first subpixel, the second subpixel, or the third subpixel.

2. The transparent display device of claim 1, wherein each of the first pixels and the second pixels includes:

a first unit pixel including the first subpixel and the third subpixel; and a second unit pixel including the second subpixel and the third subpixel.

3. The transparent display device of claim 2, wherein the first pixel and the second pixel are different from each other in positions of the first unit pixel and the second unit pixel.

4. The transparent display device of claim 2, wherein the first signal line includes a first gate line configured to supply a first gate signal to the subpixels included in the first unit pixel, and a second gate line configured to supply a second gate signal to the subpixels included in the second unit pixel.

5. The transparent display device of claim 2, wherein the second signal line includes a first data line configured to supply a first data voltage to the subpixels included in the first unit pixel, and a second data line configured to supply a second data voltage to the subpixels included in the second unit pixel.

6. The transparent display device of claim 1, wherein the first subpixel is configured to emit green light, wherein the second subpixel is configured to emit blue light, and wherein the third subpixel is configured to emit red light.

7. The transparent display device of claim 1, wherein a diagonal length between the first subpixel of the first pixel and the first subpixel of the second pixel is longer than a vertical length between the first subpixel of the first pixel and the first subpixel of the second pixel, and is shorter than a horizontal length between two first subpixels of the first pixel, which are adjacent to each other.

8. The transparent display device of claim 1, wherein a horizontal length between two second subpixels of the first pixel, which are adjacent to each other, is different from a horizontal length between two second subpixels of the second pixel, which are adjacent to each other.

9. The transparent display device of claim 8, wherein a horizontal length between two second subpixels of the first pixel, which are adjacent to each other, is longer than a horizontal length between two second subpixels of the second pixel, which are adjacent to each other.

10. The transparent display device of claim 1, wherein a width of the first signal line is narrower than that of the second signal line.

11. The transparent display device of claim 1, wherein the transmissive area has a length in the first direction, which is longer than that in the second direction.

12. The transparent display device of claim 1, wherein each of the first subpixel, the second subpixel, and the third subpixel includes at least one side oriented toward the transmissive area, which has an inclination with respect to each of the first signal line and the second signal line.

13. The transparent display device of claim 1, wherein the transmissive area has a shape selected from one of a hexagonal shape or an octagonal shape.

14. A transparent display device comprising:

a first non-transmissive area and a second non-transmissive area extended in a first direction and disposed to be spaced apart from each other;

a third non-transmissive area and a fourth non-transmissive area extended in a second direction and disposed to be spaced apart from each other;

a transmissive area provided between the first non-transmissive area and the second non-transmissive area and between the third non-transmissive area and the fourth non-transmissive area;

a first pixel disposed in first areas where the third non-transmissive area is overlapped with the first non-transmissive area and where the fourth non-transmissive area is overlapped with the first non-transmissive area; and a second pixel disposed in second areas where the third non-transmissive area is overlapped with the second non-transmissive area and where the fourth non-transmissive area is overlapped with the second non-transmissive area, wherein each of the first pixels and the second pixels includes a first subpixel emitting light of a first color, a second subpixel emitting light of a second color, and a third subpixel emitting light of a third color, and wherein at least one of the first subpixel, the second subpixel, or third subpixel has different shapes and positions in the first pixel and the second pixel.

15. The transparent display device of claim 14, wherein each of the first subpixels of the first pixel includes a first protrusion area disposed over the first non-transmissive area and protruded along the first non-transmissive area in a direction of a first side, and each of the first subpixels of the second pixel includes a second protrusion area overlapped with a part of the second non-transmissive area and protruded along the second non-transmissive area in a direction of a second side opposite to the direction of the first side.

16. The transparent display device of claim 14, wherein each of the second subpixels of the first pixel includes a protrusion area disposed over the first non-transmissive area to face the first subpixel in a same pixel and protruded along the first non-transmissive area in the direction of a second side, and each of the second subpixels of the second pixel is disposed over the third non-transmissive area or the fourth non-transmissive area to face the third subpixel in the same pixel.

17. The transparent display device of claim 14, wherein two third subpixels are included in each of the first pixels and the second pixels, the two third subpixels of the first pixel are disposed over the third non-transmissive area or the fourth non-transmissive area to face each other, and one of the two third subpixels of the second pixel is disposed over the third non-transmissive area or the fourth non-transmissive area and the other one of the two third subpixels of the second pixel is disposed over the second non-transmissive area.

18. The transparent display device of claim 14, wherein a diagonal length between the first subpixel of the first pixel and the first subpixel of the second pixel is longer than a vertical length between the first subpixel of the first pixel and the first subpixel of the second pixel, and is shorter than a horizontal length between two first subpixels of the first pixel, which are adjacent to each other.

19. The transparent display device of claim 14, wherein a horizontal length between two second subpixels of the first pixel, which are adjacent to each other, is longer than a horizontal length between two second subpixels of the second pixel, which are adjacent to each other.

* * * * *